(12) United States Patent
Reshotko et al.

(10) Patent No.: US 7,948,010 B2
(45) Date of Patent: May 24, 2011

(54) DUAL SEED SEMICONDUCTOR PHOTODETECTORS

(75) Inventors: Miriam Reshotko, Portland, OR (US); Been-Yih Jin, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 12/484,936

(22) Filed: Jun. 15, 2009

(65) Prior Publication Data

US 2009/0243023 A1    Oct. 1, 2009

Related U.S. Application Data

(62) Division of application No. 11/477,723, filed on Jun. 28, 2006, now Pat. No. 7,553,687.

(51) Int. Cl.
*H01L 21/02* (2006.01)

(52) U.S. Cl. ..... 257/190; 438/97; 438/93; 257/E31.043; 257/E31.049

(58) Field of Classification Search ............ 438/48, 438/75, 63; 257/293, 438, 458, E33.076
See application file for complete search history.

(56) References Cited

U.S. PATENT DOCUMENTS

| | | | |
|---|---|---|---|
| 5,783,839 | A | 7/1998 | Morikawa et al. |
| 7,095,006 | B2 | 8/2006 | Yang |
| 7,209,623 | B2 | 4/2007 | Morse |
| 2004/0201100 | A1 | 10/2004 | Lim et al. |
| 2005/0023554 | A1* | 2/2005 | Chu et al. ............ 257/190 |
| 2005/0051767 | A1 | 3/2005 | Leon et al. |
| 2005/0070076 | A1 | 3/2005 | Dion |
| 2005/0101100 | A1 | 5/2005 | Kretchmer et al. |
| 2005/0127275 | A1 | 6/2005 | Yang |
| 2005/0136566 | A1 | 6/2005 | Morse |
| 2005/0184354 | A1 | 8/2005 | Chu et al. |
| 2007/0152289 | A1* | 7/2007 | Morse et al. ............ 257/431 |

* cited by examiner

Primary Examiner — Matthew S Smith
Assistant Examiner — Shaka Scarlett
(74) Attorney, Agent, or Firm — Blakely, Sokoloff, Taylor & Zafman LLP

(57) ABSTRACT

Dual seed semiconductor photodetectors and methods to fabricate thereof are described. A dual seed semiconductor photodetector is formed directly on an insulating layer on a substrate. The dual seed semiconductor photodetector includes an optical layer formed on a dual seed semiconductor layer. The dual seed semiconductor layer includes a seed layer and a buffer layer. The seed layer of a first material is formed on an insulating layer over a substrate. The buffer layer is formed on the seed layer. Next, an optical layer of a second material is formed on the buffer layer. The buffer layer includes the first material and the second material. In one embodiment, the first material is silicon. In one embodiment, the second material is germanium.

7 Claims, 7 Drawing Sheets

US 7,948,010 B2

DUAL SEED SEMICONDUCTOR PHOTODETECTORS

This application is a divisional application of U.S. patent application Ser. No. 11/477,723, filed on Jun. 28, 2006 now U.S. Pat. No. 7,553,687, entitled "DUAL SEED SEMICONDUCTOR PHOTODETECTORS", and claims a priority benefit thereof.

FIELD

Embodiments of the invention relate generally to the field of microelectronic device manufacturing, and more specifically, to optical components and methods to fabricate thereof.

BACKGROUND

Currently, to fabricate an optical component, e.g., a photodetector, an optical quality germanium ("Ge") film is deposited directly on a single crystal silicon ("Si") substrate or on a silicon on isolator ("SOI") substrate.

FIG. 1A shows a Ge photodetector film 102 deposited directly on a Si substrate 101 to fabricate a photodetector. Lattice mismatch between germanium and silicon produces defects on an interface 103 between Ge photodetector film 102 and Si substrate 101. As shown in FIG. 1A, Ge photodetector film 102 is adjacent to substrate 101.

FIG. 1B shows a Ge photodetector film 112 grown directly on a silicon substrate 111 through an opening 114 in a silicon dioxide ("SiO$_2$") insulating layer 113 to fabricate a photodetector. As shown in FIG. 1B, Ge photodetector film 112 over insulating layer 113 is in direct contact with silicon substrate 111 through opening 114 in insulating layer 113.

The optical devices, e.g., photodetectors, formed directly on the semiconductor substrate in a separate process occupy the substrate space that may be needed for other devices. Additionally, forming optical devices, e.g., photodetectors, in close proximity to a substrate introduces substantial optical losses. The optical losses may be in an optical waveguide that carries light to the photodetector, because light may be absorbed in the substrate.

Further, to integrate photodetectors grown in separate processes on the separate substrates, with microprocessor and other circuit chips and devices, flip-chip bonding (to bumps), wire bonding, or other packaging solutions are used. Using the flip-chip bonding, wire bonding, or other packaging solutions introduce parasitics that negatively impact on the performance of the photodetector and other circuit devices.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

Figure 1A:
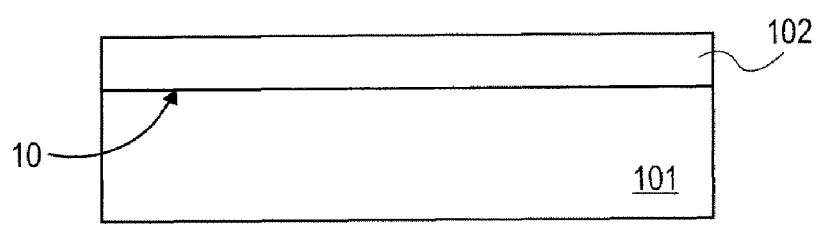
FIG. 1A shows a Ge photodetector film deposited directly on a Si substrate to fabricate a photodetector.
Figure 1B:
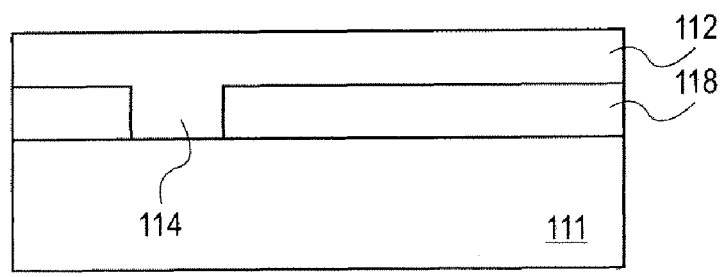
FIG. 1B shows a Ge photodetector film grown directly on a silicon substrate through an opening in a silicon dioxide ("SiO$_2$") insulating layer to fabricate a photodetector.

In the following description, numerous specific details, such as specific materials, dimensions of the elements, chemical names, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Dual seed semiconductor optical components, e.g., photodetectors, and methods to fabricate thereof are described. A dual seed semiconductor photodetector is formed directly on an insulating layer on a substrate. The dual seed semiconductor photodetector includes a photodetector layer formed on the dual seed semiconductor layer. The dual seed semiconductor layer includes a seed layer and a buffer layer. The seed layer of a first material is formed on an insulating layer over a substrate. The buffer layer is formed on the seed layer. Next, an optical layer of a second material is formed on the buffer layer. The buffer layer includes the first material and the second material. In one embodiment, the first material is silicon. In one embodiment, the second material is germanium.

Figure 2:
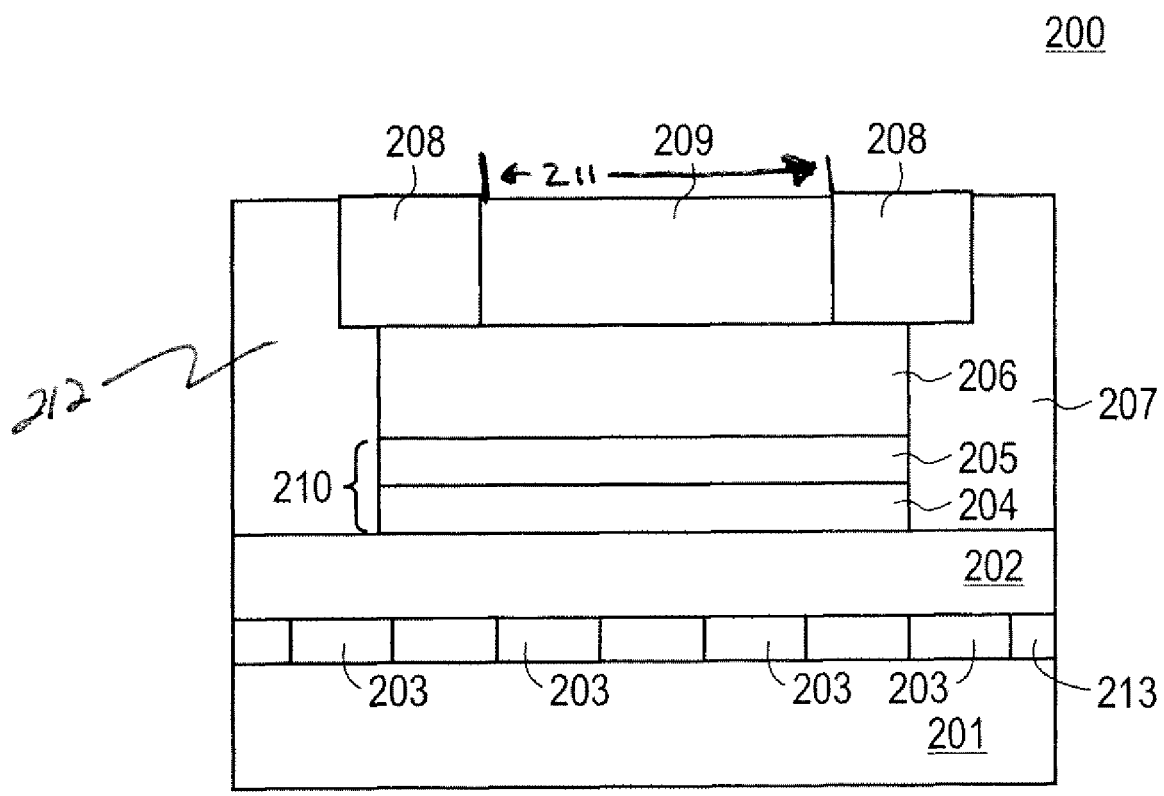
FIG. 2 is a cross-sectional view of one embodiment of a dual seed semiconductor photodetector formed directly on an insulating layer.

FIG. 2 is a cross-sectional view 200 of one embodiment of a dual seed semiconductor photodetector formed directly on an insulating layer. As shown in FIG. 2, photodetector 212 has an optical layer 206 formed on dual seed semiconductor layer 210, and contacts 208. As shown in FIG. 2, dual seed semiconductor layer 210 of the photodetector 212 is formed directly on an insulating layer 202. Insulating layer 202 is formed over substrate 201, as shown in FIG. 2. In one embodiment, substrate 201 includes monocrystalline silicon. In alternate embodiments, substrate 201 may comprise any material, for example silicon, silicon on insulator, and gallium arsenide, which is used to make any of integrated circuits, passive, and active devices. As shown in FIG. 2, substrate 201 includes front end device region 213. Front end device region 213 contains active and passive devices 203, e.g., transistors, capacitors, diodes, inductors, and interconnects, formed on substrate 201. Further, front end device region 213 may include isolation structures, metal contacts, and other device features which are coupled to conductive and interconnects layers (not shown) and contacts (not shown) formed in insulating layer 202. Substrate 201 may include insulating materials that separate active and passive devices 203 from a conductive layer or layers that are formed on top of them. As shown in FIG. 2, insulating layer 202 is formed over substrate 201. In one embodiment, insulating layer 202 may be any one, or a combination of, silicon dioxide (e.g., "$SiO_2$"), silicon nitride (e.g., "$Si_3N_4$"), polymer, sapphire, high-k dielectric, e.g., high-k oxide, low-k dielectric, e.g., a porous oxide, carbon doped oxides, or other insulating materials. In one embodiment, insulating layer 202 may contain metal vias and lines. In one embodiment, insulating layer 202 is an amorphous interlayer dielectric ("ILD"). In one embodiment, insulating layer 202 is formed over multiple conductive layers and corresponding dielectric layers over substrate 201. In one embodiment, the thickness of insulating layer 202 is at least 1 micron ("µm"). As shown in FIG. 2, dual seed semiconductor layer 210 includes a thin buffer layer 205 deposited on a thin seed layer 204. In one embodiment, a material of seed layer 204 is a polycrystalline material. Generally, polycrystalline materials are made of a large number of single crystals called grains. In one embodiment, a material of seed layer 204 includes silicon, or other semiconductor material. In one embodiment, seed layer 204 of polycrystalline silicon is deposited on insulating layer 202 that includes Si, e.g., silicon oxide, and silicon nitride. In another embodiment, a material of seed layer includes a monocrystalline material, e.g., monocrystalline silicon. Buffer layer 205 is deposited on seed layer 204, as shown in FIG. 2. An optical layer 206 is formed on dual seed semiconductor layer 210, as shown in FIG. 2. In one embodiment, buffer layer 205 includes a material of seed layer 204 and a material of optical layer 206. Optical layer 206 may include any material capable of absorbing light and in response, generating an electrical signal. In one embodiment, optical layer 206 includes germanium, silicon, silicon-germanium, or other semiconductor materials such as gallium arsenide or indium phosphide. In one embodiment, optical layer 206 includes a material that absorbs light at commercial wavelengths used for long-haul and short-haul optical interconnects. Such materials are known to one of ordinary skill in the art of optical components manufacturing. Accordingly, optical layer 206 may absorb light with wavelengths in the range of 400 nm to 1700 nm. In one embodiment, optical layer 206 may absorb light with wavelengths in the range of 850 nm to 1550 nm. In one embodiment, optical layer 206 includes a polycrystalline Ge. In one embodiment, buffer layer 205 includes a polycrystalline silicon-germanium ("$Si_{1-x}Ge_x$"). In one embodiment, the relative content X of Ge is about constant. In another embodiment, the relative content X of Ge in buffer layer 205 can be gradually increased along the thickness of graded buffer layer 205 from e.g., 0% at an interface with seed layer 204 to e.g., 100% at the interface with optical layer 206. In one embodiment, the relative content X of Ge in buffer layer 205 of $Si_{1-x}Ge_x$ is at least 1%. In another embodiment, the relative content X of Ge in buffer layer 205 of $Si_{1-x}Ge_x$ is in the approximate range of 10% to 90%. In yet another embodiment, the relative content X of Ge in buffer layer 205 of $Si_{1-x}Ge_x$ is about constant and may be in the approximate range of 20% to 60%. In one embodiment, optical layer 206 of polycrystalline Ge is formed on buffer layer 205 of polycrystalline silicon-germanium that is deposited on seed layer 204 of polycrystalline Si on insulating substrate 202 that includes Si. In one embodiment, the thickness of seed layer 204 is between about 25 angstroms and about 1000 angstroms and the thickness of buffer layer 205 is between about 25 angstroms and about 1000 angstroms. Depositing dual seed semiconductor layer 210 on insulating layer 202 is described in further detail below with respect to FIGS. 3A-3E and 4A-4F.

As shown in FIG. 2, electrical contacts 208 are formed on optical layer 206. In one embodiment, electrical contacts 208 include a metal, a metal alloy or a compound. In one embodiment, electrical contacts 208 include e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In one embodiment, a distance 211 between metal contacts 208 defines a window of photodetector 212 for the incident light. In one embodiment, distance 211 between metal contacts 208 may be, e.g., in the approximate range of 10 nanometers ("nm") to 100 microns ("µm") depending on the design of photodetector 212. In one embodiment, photodetector 212 captures light through the window defined by contacts 208, generates an electrical signal from the received light, and transmits the electrical signal to the front end device region 213. As shown in FIG. 2, insulating layer 207 is formed on top of optical layer between contacts 208, and on portions of insulating layer 202 to electrically isolate photodetector 212, e.g., from unwanted electrical parasitics that may be produced by neighboring devices and conductors. As shown in FIG. 2, photodetector 212 is separated from substrate 201 by thick insulating layer 202 that provides an optical isolation for waveguides that can be connected to photodetector 212. In one embodiment, thick insulating layer 202 contains metal vias and lines. Separating the photodetector 212 from substrate 202 substantially reduces optical losses. As shown in FIG. 2, contacts 208 cover up the edges of the optical layer 206 to make sure that the light does not get into the portions of the photodetector 212 where there is not an electrical field. As shown in FIG. 2, photodetector 212 is formed in the back end of the process on insulating layer 202 after front end device region 213 having active and passive devices 203 and/or one or more metal layers (not shown) are formed on substrate 201.

Figure 3A:
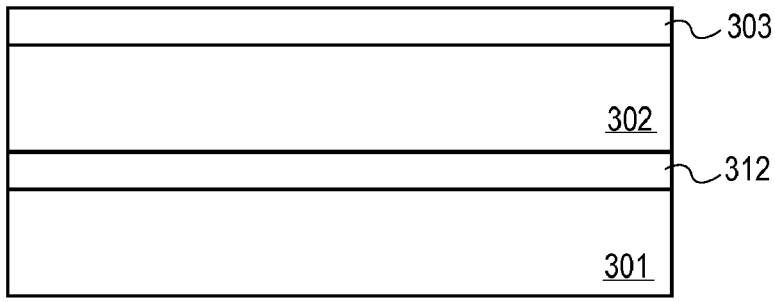
FIG. 3A is a cross-sectional view of one embodiment of a semiconductor structure to fabricate a dual seed semiconductor photodetector.

FIG. 3A is a cross-sectional view 300 of one embodiment of a semiconductor structure to fabricate a dual seed semiconductor photodetector. As shown in FIG. 3A, a seed layer 303 is deposited on insulating layer 302 formed on substrate 301. In one embodiment, substrate 301 includes monocrystalline silicon. In alternate embodiments, substrate 301 may comprise any material, for example silicon, silicon on insulator, and gallium arsenide, which is used to make any of integrated circuits, passive, and active devices, as described above. In one embodiment, a front end device region 312 that includes active and passive devices, e.g., transistors, capacitors, diodes, inductors, and interconnects is formed on substrate 301, as described above with respect to FIG. 2. As shown in FIG. 3A, a thick insulating layer 302 is formed on substrate 301. In one embodiment, thick insulating layer 302 covers front end device region 312 that has active and passive devices (not shown) grown on substrate 301. In one embodiment, insulating layer 302 may be any one, or a combination of, silicon dioxide (e.g., "$SiO_2$"), silicon nitride (e.g., "$Si_3N_4$"), polymer, sapphire, high-k dielectric, e.g., high-k oxide, low-k dielectric, e.g., a porous oxide, carbon doped oxides, or other insulating materials. In one embodiment, insulating layer 302 is an amorphous interlayer dielectric ("ILD") that includes silicon, e.g., $SiO_2$. In one embodiment, the thickness of insulating layer 302 is at least 1 micron ("µm"). In one embodiment, insulating layer 302 is deposited using a deposition technique, such as, but not limited to, chemical vapor deposition (CVD), plasma enhanced chemical vapor deposition (PECVD), or high density plasma chemical vapor deposition (HDP CVD). Deposition of insulating layer 302 on substrate 301 of monocrystalline silicon is known to one of ordinary skill in the art of microelectronic device manufacturing. As shown in FIG. 3A, seed layer 303 is formed on insulating layer 302. In one embodiment, seed layer 303 includes a polycrystalline material, e.g., polycrystalline silicon. In one embodiment, seed layer 303 of polycrystalline silicon is deposited on insulating layer 202 that includes Si, e.g., silicon oxide, and silicon nitride. In one embodiment, seed layer 303 is formed on insulating layer 302 using a chemical vapor deposition ("CVD") technique. In one embodiment, seed layer 303 is formed on insulating layer 302 using CVD at temperature in the approximate range of 300 C to 900 C and pressure in the approximate range of 1 torr to 500 torr. In another embodiment, seed layer 303 is formed on insulating layer 302 by sputtering. The thickness of seed layer 303 is such that seed layer 303 is not optically significant. In one embodiment, the thickness of seed layer 303 is between about 25 angstroms ("Å") and about 1000 Å. In one embodiment, the thickness of seed layer 303 of Si deposited on insulating layer of $SiO_2$ is in the approximate range of 50 Å to 500 Å.

Figure 3B:
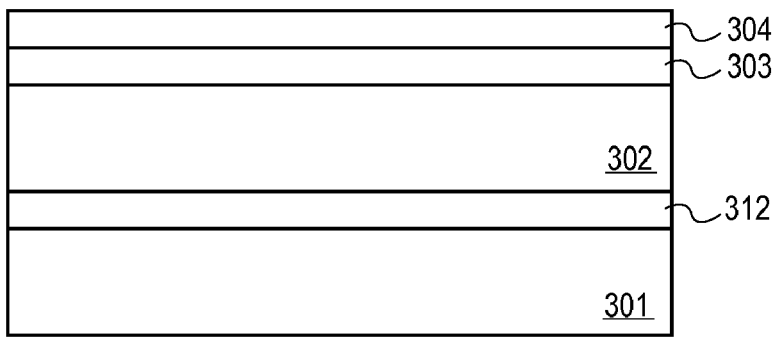
FIG. 3B is a view similar to FIG. 3A, after a buffer layer is formed on a seed layer to form a dual seed semiconductor layer.

FIG. 3B is a view similar to FIG. 3A, after buffer layer 304 is formed on seed layer 303 to form a dual seed semiconductor layer. In one embodiment, buffer layer 304 includes a polycrystalline silicon-germanium ("$Si_{1-x}Ge_x$"). In one embodiment, the relative content X of Ge is gradually increased along the thickness of graded buffer layer 304 from about 0% at an interface with seed layer 303 to about 100% at the interface with optical layer formed later on in the process. In one embodiment, the relative content X of Ge in buffer layer 304 of $Si_{1-x}Ge_x$ is at least 1%. In another embodiment, the relative constant content X of Ge in buffer layer 304 of $Si_{1-x}Ge_x$ is in the approximate range of 20% to 80%. In one embodiment, buffer layer 304 is formed on seed layer 303 using a chemical vapor deposition technique. In one embodiment, buffer layer 304 is formed on seed layer 303 using CVD with simultaneous flow of Silane (SiH4) and Germane (GeH4) gases or simultaneous flow of DichloroSilane (SiCl2H2) and Germane gases. In one embodiment the temperature during the CVD process is in the approximate range of 300 C to 900 C and pressure in the approximate range of 1 torr to 760 torr. In another embodiment, buffer layer 304 is formed on seed layer 303 by sputtering. The thickness of buffer layer 304 is such that buffer layer 304 is not optically significant. In one embodiment, buffer layer 304 is formed on seed layer 303 to a thickness between about 25 Å and about 1000 Å. In one embodiment, the thickness of buffer layer 304 of $Si_{1-x}Ge_x$ deposited on seed layer 303 of Si is in the approximate range of 50 Å to 500 Å.

Figure 3C:
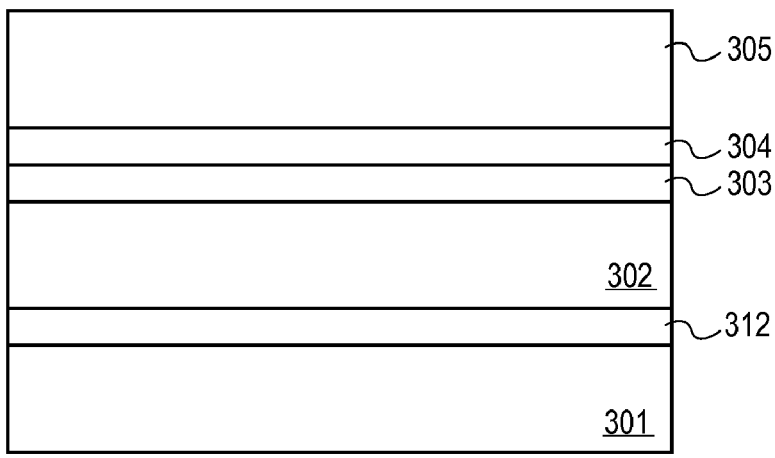
FIG. 3C is a view similar to FIG. 3B, after an optical layer is formed on a buffer layer to form an optical layer/buffer layer/seed layer stack.

FIG. 3C is a view similar to FIG. 3B, after an optical layer 305 is formed on buffer layer 304 to form an optical layer/buffer layer/seed layer stack. Optical layer 305 includes an optical quality material, e.g., optical quality germanium, silicon, silicon-germanium, or other semiconductor materials such as gallium arsenide or indium phosphide. In one embodiment, optical layer 305 of pure polycrystalline Ge is formed on buffer layer 304 of polycrystalline $Si_{1-x}Ge_x$. In one embodiment, photodetector layer 305 of intrinsic Ge having a carrier concentration less than $1 \times 10^{15}$ cm$^{-3}$ is deposited on buffer layer 304 of polycrystalline $Si_{1-x}Ge_x$. In one embodiment, the relative content X of Ge in buffer layer 304 of $Si_{1-x}Ge_x$ is gradually increased from about 0 at seed layer 303 of silicon to about 1 at optical layer 305 of Ge.

In one embodiment, optical layer 305 is formed on buffer layer 304 using a CVD process. In one embodiment, optical layer 305 is formed on buffer layer 304 using CVD at temperature in the approximate range of 300° C. to 800° C. and pressure in the approximate range of 1 torr to 760 torr. In another embodiment, optical layer 305 is formed on buffer layer 304 by sputtering. In one embodiment, depositing of seed layer 303 on insulating layer 302, buffer layer 304 on seed layer 303 is optimized for deposition temperature that may be in the approximate range of 300° C. to 800° C., for annealing times that may be from about 1 minute to about 30 minutes at the annealing temperatures from about 500° C. to about 800° C. range, 0-1 hour and for deposition rates that may be from about 100 A/min to about 500 A/min, to create an optimal grain size in a dual seed semiconductor layer that includes seed layer 303 and buffer layer 304. Such optimization in turn creates an optimal grain size (morphology) of optical layer 305 deposited on buffer layer 304 that maximizes photodetector efficiency and minimizes photodetector dark current generation. In one embodiment, optical layer 305 is deposited to the thickness in the approximate range of 1000 angstroms to 6000 angstroms.

Figure 3D:
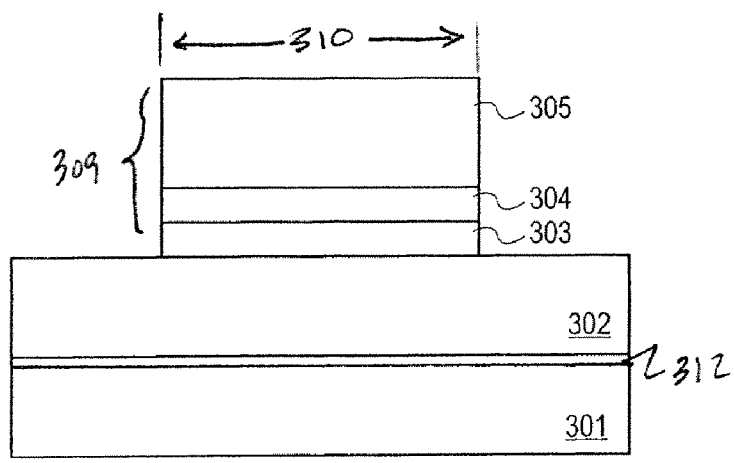
FIG. 3D is a view similar to FIG. 3C, after an optical layer/buffer layer/seed layer stack is patterned and etched to form a photodetector mesa structure.

FIG. 3D is a view similar to FIG. 3C, after an optical layer/buffer layer/seed layer stack is patterned and etched to form a photodetector mesa structure 309. In one embodiment, a photoresist (not shown) is deposited on optical layer 305, and patterned. Next, the patterned photoresist on the optical layer/buffer layer/seed layer stack is etched to form a photodetector mesa structure 309. Patterning and etching is known to one of ordinary skill in the art of microelectronic device manufacturing. Photodetector mesa structure 309 may have a variety of shapes and sizes. For example, the photodetector mesa structure 309 may have a substantially square or rectangular cross-sectional shape. Photodetector mesa structure 309 may extend as far laterally and as high vertically above insulating layer 302 as needed to capture light. For example, the cross-sectional width 310 of photodetector mesa structure 309 may range from 0.5 µm to 100 µm and the cross-sectional thickness of photodetector 309 may range from 0.1 µm to 1 µm. In an embodiment, the cross-sectional width and thickness of photodetector structure may be approximately 5 µm and 0.5 µm respectively.

Figure 3E:
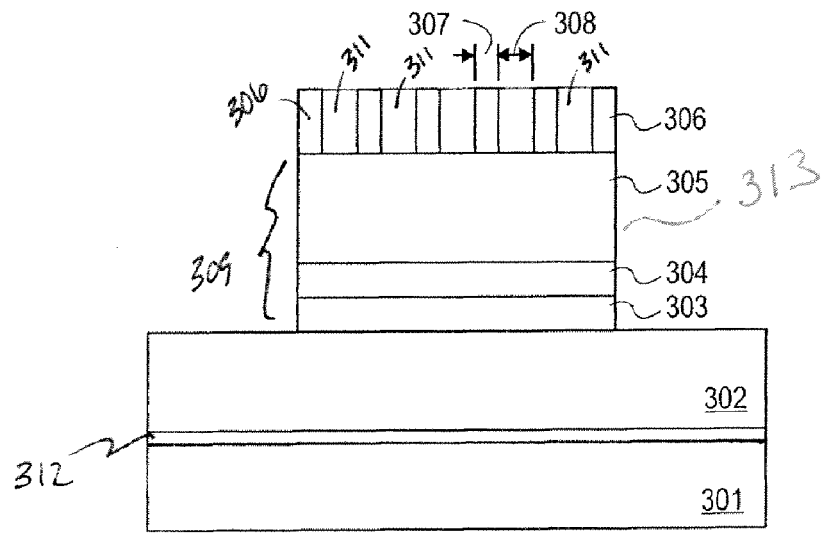
FIG. 3E is a view similar to FIG. 3D, after electrical contacts are formed on the optical layer.

FIG. 3E is a view similar to FIG. 3D, after electrical contacts 306 are formed on optical layer 305. Contacts 306 may be formed by variety of methods known to one of ordinary skill in the art of microelectronic device manufacturing. In one embodiment, contacts 306 are patterned on optical layer 305 by lift-off, or subtractive etch techniques known to one of ordinary skill in the art of microelectronic device manufacturing. In another embodiment, contacts 306 are formed on optical layer 305 using a damascene technique that includes etching trenches (not shown) in insulating layer 311 deposited on optical layer 305, filling the trenches with a conductive material (not shown), and then planarizing the conductive material to the top surface of the insulating layer 311. Depositing of the insulating layer 311, e.g., silicon dioxide (e.g., "$SiO_2$"), silicon nitride (e.g., "$Si_3N_4$"), on optical layer 305 may be performed using one of a deposition technique, such as, but not limited to, chemical vapor deposition (CVD), plasma enhanced chemical vapor deposition (PECVD), or high density plasma chemical vapor deposition (HDP CVD). In one embodiment, electrical contacts 306 include a metal, a metal alloy or a compound. In one embodiment, electrical contacts 306 include e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In one embodiment, distance 308 between electrical contacts 306 may be, e.g., in the approximate range of 100 nanometers ("nm") to 100 microns ("µm") depending on the design of the photodetector. In one embodiment, size 307 of the contacts 306 is in the approximate range of 0.01 µm to 10 µm, and distance 308 between the contacts 306 is in the approximate range of 0.01 µm to 10 µm. In one embodiment, contacts 306 are formed on optical layer 305 parallel to each other. In another embodiment, contacts 306 on optical layer 305 form interdigitated contacts. In yet another embodiment, contacts 306 on optical layer 305 form interleaved contacts. Parallel, interdigitated, and interleaved contacts are known to one of ordinary skill in the art of microelectronic device manufacturing. As shown in FIG. 3E, photodetector 313 is formed on insulating layer 302 deposited over one or more metal layers (not shown) and front end device region 312 formed on substrate 301. In another embodiment, a plurality of photodetectors (not shown) may be formed on insulating layer 302 using methods described above.

Figure 4A:
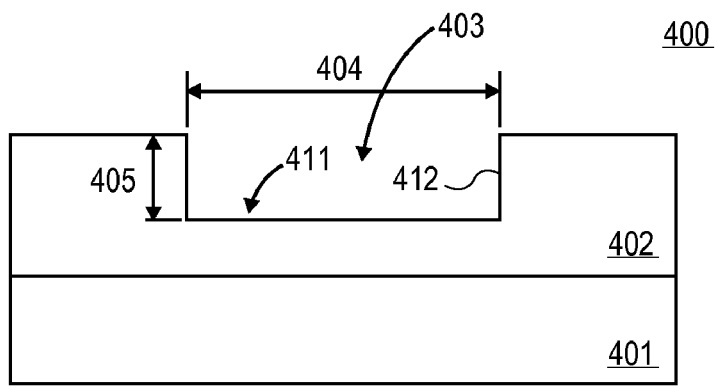
FIG. 4A is a cross-sectional view of another embodiment of a semiconductor structure to fabricate a dual seed semiconductor photodetector.

FIG. 4A is a cross-sectional view 400 of another embodiment of a semiconductor structure to fabricate a dual seed semiconductor photodetector. As shown in FIG. 4A, an insulating layer 402 is deposited on substrate 401. In one embodiment, substrate 401 includes monocrystalline silicon. In alternate embodiments, substrate 401 may comprise any material, for example silicon, silicon on insulator, and gallium arsenide, which is used to make any of integrated circuits, passive, and active devices, as described above. In one embodiment, substrate 401 includes a front end device region (not shown). The front end device region typically includes active and passive devices, e.g., transistors, capacitors, diodes, inductors, and interconnects formed on substrate 401, as described above with respect to FIGS. 2 and 3A. As shown in FIG. 4A, a thick insulating layer 402 is formed on substrate 401. In one embodiment, insulating layer 402 may be any one, or a combination of, silicon dioxide (e.g., "$SiO_2$"), silicon nitride (e.g., "$Si_3N_4$"), polymer, sapphire, high-k dielectric, e.g., high-k oxide, low-k dielectric, e.g., a porous oxide, carbon doped oxides, or other insulating materials. In one embodiment, insulating layer 402 is an amorphous interlayer dielectric ("ILD") that includes silicon, e.g., $SiO_2$. In one embodiment, the thickness of insulating layer 402 is at least 1 micron ("µm"). In one embodiment, insulating layer 402 is deposited using a deposition technique, such as, but not limited to, chemical vapor deposition (CVD), plasma enhanced chemical vapor deposition (PECVD), or high density plasma chemical vapor deposition (HDP CVD). Depositing of insulating layer 402 on substrate 401 of monocrystalline silicon is known to one of ordinary skill in the art of microelectronic device manufacturing. As shown in FIG. 4A, trench 403 is formed in insulating layer 402. In one embodiment, trench 403 is formed by patterning and etching insulating layer 402. Patterning and etching trenches in insulating layer 402 is known to one of ordinary skill in the art of microelectronic device manufacturing. As shown in FIG. 4A, trench 403 has a bottom 411 and sidewalls 412. In one embodiment, trench 403 has a high aspect ratio. That is, the ratio of depth 405 to width 404 of trench 403 is substantially high, for example, is at least 2. In one embodiment, depth 405 is between about 0.5 µm and about 2 µm and width 404 is between about 0.1 µm and about 0.5 µm.

Figure 4B:
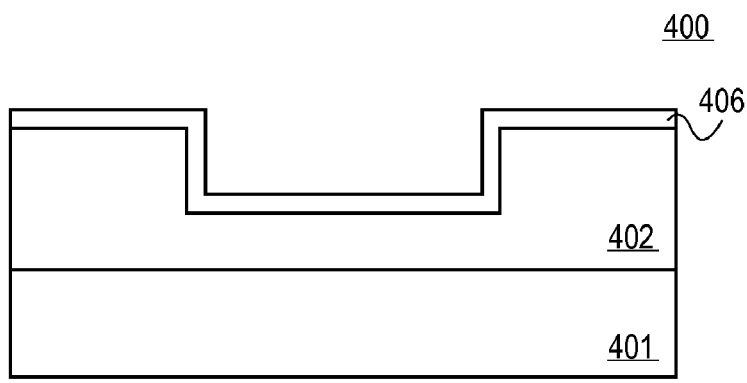
FIG. 4B is a view similar to FIG. 4A, after a seed layer is formed on an insulating layer.

FIG. 4B is a view similar to FIG. 4A, after seed layer 406 is formed on insulating layer 402. As shown in FIG. 4B, seed layer 406 covers sidewalls 412 and bottom 411 of trench 403 and top portions of insulating layer 402 outside trench 403. In one embodiment, seed layer 406 includes a polycrystalline material, e.g., polycrystalline silicon. In one embodiment, seed layer 406 of polycrystalline silicon is deposited on insulating layer 402 that includes Si, e.g., silicon oxide, and silicon nitride. In one embodiment, seed layer 406 is formed on insulating layer 402 using a chemical vapor deposition ("CVD") technique, sputtering, or a combination thereof as described above. The thickness of seed layer 406 is such that seed layer 406 is not optically significant. In one embodiment, the thickness of seed layer 406 is between about 25 Å and about 1000 Å. In one embodiment, the thickness of seed layer 406 is less than one third of the width 404 of the trench 403. In one embodiment, the thickness of seed layer 406 of Si deposited on insulating layer 402 of $SiO_2$ is in the approximate range of 25 Å to 1000 Å.

Figure 4C:
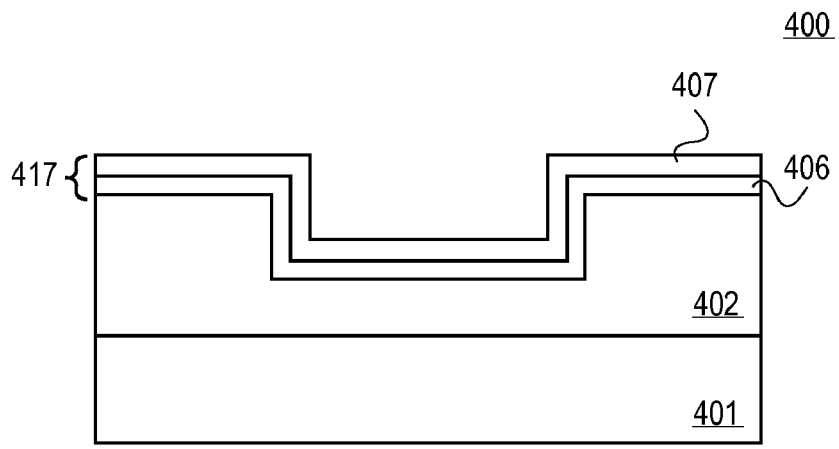
FIG. 4C is a view similar to FIG. 4B, after a buffer layer is formed on the seed layer to form a dual seed semiconductor layer.

FIG. 4C is a view similar to FIG. 4B, after buffer layer 407 is formed on seed layer 406 to form a dual seed semiconductor layer 417. In one embodiment, buffer layer 407 includes a polycrystalline $Si_{1-x}Ge_x$. In one embodiment, the relative content X of Ge is gradually increased along the thickness of buffer layer 304 from e.g., 10% at an interface with seed layer 406 to e.g., 100% at the interface with optical layer formed later on in the process. In one embodiment, the relative content X of Ge in graded buffer layer 407 of $Si_{1-x}Ge_x$ is at least 1%. In another embodiment, the relative content X of Ge in buffer layer 407 of $Si_{1-x}Ge_x$ is about constant and may be in the approximate range of 20% to 60%. In one embodiment, buffer layer 407 is formed on seed layer 406 using a chemical vapor deposition technique and/or sputtering, as described above. The thickness of buffer layer 407 is such that buffer layer 407 is not optically significant. In one embodiment, buffer layer 407 is formed on seed layer 406 to a thickness between about 25 Å and about 1000 Å. In one embodiment, the thickness of buffer layer 407 of $Si_{1-x}Ge_x$ deposited on seed layer 406 of Si is in the approximate range of 25 Å to 1000 Å.

Figure 4D:
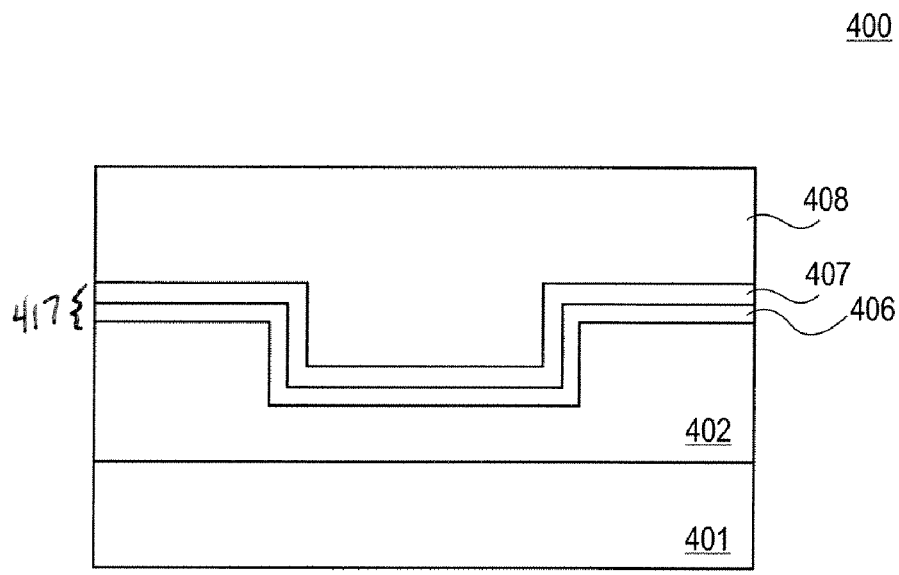
FIG. 4D is a view similar to FIG. 4C, after an optical layer is formed on the buffer layer.

FIG. 4D is a view similar to FIG. 4C, after an optical layer 408 is formed on buffer layer 407. As shown in FIG. 4D, optical layer 408 fills trench 403 and covers top portions of dual seed semiconductor layer 417 outside trench 403. Optical layer 408 includes an optical quality material, e.g., optical quality germanium, silicon, silicon-germanium, or other semiconductor materials such as gallium arsenide or indium phosphide. In one embodiment, optical layer 408 of pure polycrystalline Ge is formed on buffer layer 407 of polycrystalline $Si_{1-x}Ge_x$. In one embodiment, optical layer 408 of intrinsic Ge having a carrier concentration less than $1\times10^{15}$ $cm^{-3}$ is deposited on buffer layer 407 of polycrystalline $Si_{1-x}Ge_x$. In one embodiment, the relative content X of Ge in graded buffer layer 407 of $Si_{1-x}Ge_x$ is gradually increased from about 0 at seed layer 406 of silicon to about 1 at optical layer 408 of Ge. In one embodiment, optical layer 305 is formed on buffer layer 304 using a CVD process, and/or sputtering, as described above. In one embodiment, depositing of seed layer 406 on insulating layer 402, buffer layer 407 on seed layer 406 is optimized for a high aspect ratio (for example, greater than 2) trench fill, deposition temperature in approximate range of 300 C to 800 C, anneal times of 1 min to 30 min at anneal temperature of 500 C-800 C, and deposition rates range of 100 A/min to 500 A/min, to create optimal grain size in dual seed semiconductor layer 417. Such optimization in turn creates an optimal grain size (morphology) of optical layer 408 deposited on buffer layer 407 that maximizes photodetector efficiency and minimizes photodetector dark current generation. In one embodiment, optical layer 408 is deposited onto dual seed semiconductor layer 417 to the thickness in the approximate range of 1000 angstroms to 6000 angstroms. In one embodiment, optical layer 408 is deposited onto dual seed semiconductor layer 417 to the thickness of at least about 1.5 times of depth 405 of trench 403. In one embodiment, if depth 405 of trench 403 is in the approximate range of 0.1 μm to 2 μm, optical layer 408 is deposited to the thickness in the approximate range of 0.15 μm to 3 μm.

Figure 4E:
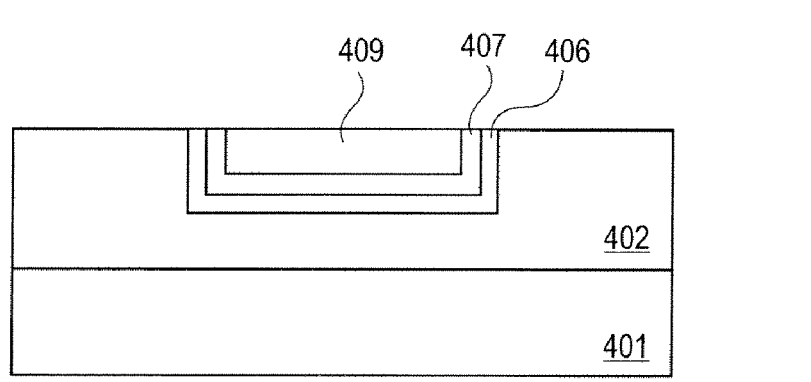
FIG. 4E is a view similar to FIG. 4D, after the optical layer and the dual seed semiconductor layer are planarized to the top surface of the insulating layer.

FIG. 4E is a view similar to FIG. 4D, after optical layer 408 and dual seed semiconductor layer 417 are planarized to the top surface of dielectric layer 402. As shown in FIG. 4E, portions of optical layer 408 and portions of dual seed semiconductor layer 417 are removed from the top surface of insulating layer 402 outside trench 403 while portion (photodetector body) 410 of optical layer 408 remains in trench 403. As shown in FIG. 4E, the top surface of photodetector body 409 levels with the top surface of insulating layer 402. In one embodiment, optical layer 408 and dual seed semiconductor layer 417 are polished back using a chemical-mechanical polishing ("CMP") technique known to one of ordinary skill in the art of microelectronic device manufacturing. In one embodiment, multiple photodetector bodies 409 may be formed on insulating layer 302 using methods described above to form a plurality of photodetectors.

Figure 4F:
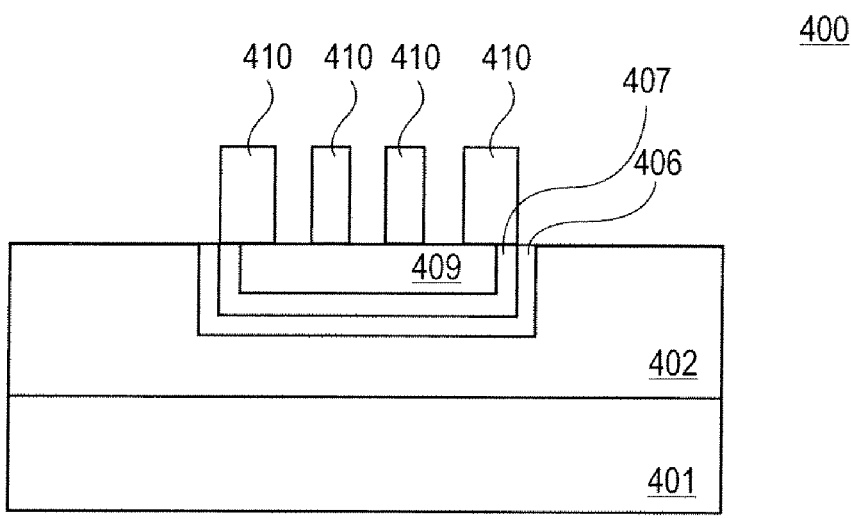
FIG. 4F is a view similar to FIG. 4E, after electrical contacts are formed on a photodetector body.

FIG. 4F is a view similar to FIG. 4E, after electrical contacts 410 are formed on photodetector body 409. Contacts 409 may be formed by variety of methods known to one of ordinary skill in the art of microelectronic device manufacturing, as described above with respect to FIG. 2 and FIG. 3E.

The processes described above with respect to FIGS. 2, 3A-3E, 4A-4F allow optical devices, e.g., photodetectors, to be fabricated in the same process flow along with microelectronic circuits, and to be inserted near the end of the process flow, after many layers of metallization. Therefore, the changes in the basic microelectronic device manufacturing process flow are minimal, both in terms of process development and cost. The processes described above also allow for optical isolation for waveguides which connect optical devices such as photo detectors. By enabling an optical layer to be fabricated in the same process flow as electronic devices, optical device parasitics can be reduced and performance of the devices is enhanced.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A photodetector, comprising:
   a seed layer of a first material formed on an insulating layer over a substrate, wherein the first material includes a polycrystalline silicon;
   a buffer layer on the seed layer, wherein the buffer layer includes a polycrystalline silicon germanium; and
   an optical layer of a second material on the buffer layer, wherein the second material includes a polycrystalline germanium.

2. The photodetector of claim 1, wherein the buffer layer includes the first material and the second material.

3. The photodetector of claim 1, wherein the thickness of the seed layer is between 25 angstroms and 1000 angstroms and the thickness of the buffer layer is between 25 angstroms and 1000 angstroms.

4. The photodetector of claim 1, wherein the first material includes silicon, and the second material includes germanium.

5. The photodetector of claim 1, wherein the buffer layer includes SiGe.

6. The photodetector of claim 1, further including electrical contacts on the optical layer.

7. The photodetector of claim 1, wherein the thickness of the insulating layer is at least 1 micron.

* * * * *